US006554948B1

(12) United States Patent
Ferrier

(10) Patent No.: US 6,554,948 B1
(45) Date of Patent: *Apr. 29, 2003

(54) PROCESS FOR IMPROVING THE ADHESION OF POLYMERIC MATERIALS TO METAL SURFACES

(76) Inventor: Donald Ferrier, 455 Prospect St., Thomaston, CT (US) 06787

( * ) Notice: Subject to any disclaimer, the term of this patent is extended or adjusted under 35 U.S.C. 154(b) by 183 days.

This patent is subject to a terminal disclaimer.

(21) Appl. No.: 09/643,813

(22) Filed: Aug. 22, 2000

(51) Int. Cl.⁷ ................................................. B05D 3/00
(52) U.S. Cl. ................................. 156/326; 106/287.21
(58) Field of Search ...................... 156/326; 106/287.21

(56) References Cited

U.S. PATENT DOCUMENTS

| | | |
|---|---|---|
| 4,051,057 A | 9/1977 | Ericson et al. |
| 4,175,964 A | 11/1979 | Uchida et al. |
| 4,409,037 A | 10/1983 | Landau |
| 4,619,871 A | 10/1986 | Takami |
| 4,642,161 A | 2/1987 | Akahoski et al. |
| 4,775,444 A | 10/1988 | Cordani |
| 4,844,981 A | 7/1989 | Landau |
| 4,902,551 A | 2/1990 | Nakaso et al. |
| 4,902,734 A | 2/1990 | Dexter et al. |
| 4,981,560 A | 1/1991 | Kajihara et al. |
| 4,997,516 A | 3/1991 | Adler |
| 4,997,722 A | 3/1991 | Adler |
| 5,112,428 A | 5/1992 | Correa et al. |
| 5,128,065 A | 7/1992 | Hollander |
| 5,289,630 A | 3/1994 | Ferrier et al. |
| 5,366,814 A | 11/1994 | Yamanishi et al. |
| 5,550,006 A | 8/1996 | Larson et al. |
| 5,712,047 A | 1/1998 | Aso et al. |
| 5,800,859 A | 9/1998 | Price et al. |
| 5,869,130 A | 2/1999 | Ferrier |
| 6,020,029 A | 2/2000 | Ferrier et al. |
| 6,383,272 B1 | 5/2002 | Ferrier |

FOREIGN PATENT DOCUMENTS

| | | |
|---|---|---|
| DE | 2557269 | 6/1977 |
| DE | 19732419 A1 | 2/1998 |
| EP | 0442197 A2 | 8/1991 |
| EP | 0670379 A1 | 2/1995 |
| EP | 0696651 A1 | 2/1996 |
| EP | 0757118 A1 | 2/1997 |
| EP | 0887439 A1 | 12/1998 |
| FR | 2134333 | 12/1972 |
| JP | 57116775 | 7/1982 |
| JP | 01240683 | 9/1989 |
| JP | 03079778 | 4/1991 |
| JP | 06057453 | 3/1994 |
| JP | 06192855 | 7/1994 |
| JP | 10056263 | 2/1998 |
| WO | WO94/16120 | 7/1994 |
| WO | WO96/19097 | 6/1996 |

OTHER PUBLICATIONS

Appelt et al, IBM Technical Disclosure Bulletin, vol. 25 No. 6 (156/326), Nov. 1982.*

An Alternate Route to Red Oxide for Inner Layers, Allan G. Osborne, PC Fab, Aug. 1984, p. 28.

* cited by examiner

Primary Examiner—Michael W. Ball
Assistant Examiner—Barbara J. Musser
(74) Attorney, Agent, or Firm—Carmody & Torrance LLP

(57) ABSTRACT

A process is described for treating metal surfaces with a composition comprising an oxidizer, an acid, a corrosion inhibitor, a benzotriazole with an electron withdrawing group in the 1-position which electron withdrawing group is a stronger electron withdrawer than a hydrogen group, and optionally, a source of adhesion enhancing species selected from the group consisting of molybdates, tungstates, tantalates, niobates, vanadates, isopoly or heteropoly acids of molybdenum, tungsten, tantalum, niobium, vanadium, and combinations of any of the foregoing in order to increase the adhesion of polymeric materials to the metal surface.

29 Claims, No Drawings

PROCESS FOR IMPROVING THE ADHESION OF POLYMERIC MATERIALS TO METAL SURFACES

BACKGROUND OF THE INVENTION

The present invention relates to printed circuits, and more particularly to a process for fabricating a multilayer printed circuit.

Printed circuits containing one or more circuitry innerlayers are in prominent use today as demand increases for further and further weight and space conservation in electronic devices.

In the typical fabrication of a multilayer printed circuit, patterned circuitry innerlayers are first prepared by a process in which a copper foil-clad dielectric substrate material is patterned with resist in the positive image of the desired circuitry pattern, followed by etching away of the exposed copper. Upon removal of the resist, there remains the desired copper circuitry pattern.

One or more circuitry innerlayers of any particular type or types of circuitry pattern, as well as circuitry innerlayers which might constitute ground planes and power planes, are assembled into a multilayer circuit by interposing one or more partially-cured dielectric substrate material layers (so-called "pre-preg" layers) between the circuitry innerlayers to form a composite of alternating circuitry innerlayers and dielectric substrate material. The composite is then subjected to heat and pressure to cure the partially-cured substrate material and achieve bonding of circuitry innerlayers thereto. The so-cured composite will then have a number of through-holes drilled therethrough, which are then metallized to provide a means for conductively interconnecting all circuitry layers. In the course of the through-hole metallizing process, desired circuitry patterns also typically will be formed on the outer-facing layers of the multilayer composite.

An alternate approach to the formation of a multilayer printed circuit board is through additive or surface laminer circuitry techniques. These techniques begin with a non-conductive substrate, upon which the circuit elements are additively plated. Further layers are achieved by repeatedly applying an imageable coating upon the circuitry and plating further circuit elements upon the imageable coating.

It has long been known that the strength of the adhesive bond formed between the copper metal of the circuitry innerlayers and the cured pre-preg layers, or other non-conductive coatings, in contact therewith leaves something to be desired, with the result that the cured multilayer composite or the coating is susceptible to delamination in subsequent processing and/or use. In response to this problem, the art developed the technique of forming on the copper surfaces of the circuitry innerlayers (before assembling them with pre-preg layers into a multilayer composite) a layer of copper oxide, such as by chemical oxidation of the copper surfaces. The earliest efforts in this regard (so-called "black oxide" adhesion promoters) produced somewhat minimal improvement in the bonding of the circuitry innerlayers to the dielectric substrate layers in the final multilayer circuit, as compared to that obtained without copper oxide provision. Subsequent variations on the black oxide technique included methods wherein there is first produced a black oxide coating on the copper surface, followed by post-treatment of the black oxide deposit with 15% sulfuric acid to produce a "red oxide" to serve as the adhesion promoter, such as disclosed by A. G. Osborne, "An Alternate Route To Red Oxide For Inner Layers", PC Fab. August, 1984, as well as variations involving direct formation of red oxide adhesion promoter, with varying degrees of success being obtained. The most notable improvement in this art is represented in the U.S. Pat. Nos. 4,409,037 and 4,844,981 to Landau, the teachings both of which are included herein by reference in their entirety, involving oxides formed from relatively high chlorite/relatively low caustic copper oxidizing compositions, and producing substantially improved results in circuitry innerlayer adhesion.

As earlier noted, the assembled and cured multilayer circuit composite is provided with through-holes which then require metallization in order to serve as a means for conductive interconnection of the circuitry layers of the circuit. The metallizing of the through-holes involves steps of resin desmearing of the hole surfaces, catalytic activation, electroless copper depositing, electrolytic copper depositing, and the like. Many of these process steps involve the use of media, such as acids, which are capable of dissolving the copper oxide adhesion promoter coating on the circuitry innerlayer portions exposed at or near the through hole. This localized dissolution of the copper oxide, which is evidenced by formation around the through-hole of a pink ring or halo (owing to the pink color of the underlying copper metal thereby exposed), can in turn lead to localized delamination in the multilayer circuit.

The art is well aware of this "pink ring" phenomenon, and has expended extensive effort in seeking to arrive at a multilayer printed circuit fabrication process which is not susceptible to such localized delamination. One suggested approach has been to provide the adhesion promoting copper oxide as a thick coating so as to retard its dissolution in subsequent processing simply by virtue of sheer volume of copper oxide present. This turns out to be essentially counter-productive, however, because the thicker oxide coating is inherently less effective as an adhesion promoter per se. Other suggestions relating to optimization of the pressing/curing conditions for assembling the multilayer composite have met with only limited success.

Other approaches to this problem involve post-treatment of the copper oxide adhesion promoter coating prior to assembly of circuitry innerlayers and pre-preg layers into a multilayer composite. For example, U.S. Pat. No. 4,775,444 to Cordani discloses a process in which the copper surfaces of the circuitry innerlayers are first provided with a copper oxide coating and then contacted with an aqueous chromic acid solution before the circuitry innerlayers are incorporated into the multilayer assembly. The treatment serves to stabilize and/or protect the copper oxide coating from dissolution in the acidic media encountered in subsequent processing steps (e.g. through-hole metallization), thereby minimizing pink ring/delamination possibilities.

U.S. Pat. No. 4,642,161 to Akahoshi et al, U.S. Pat. No. 4,902,551 to Nakaso et al, and U.S. Pat. No. 4,981,560 to Kajihara et al, and a number of references cited therein, relate to processes in which the copper surfaces of the circuitry innerlayers, prior to incorporation of the circuitry innerlayers into a multilayer circuit assembly, are first treated to provide a surface coating of adhesion-promoting copper oxide. The copper oxide so formed is then reduced to metallic copper using particular reducing agents and conditions. As a consequence, the multilayer assembly employing such circuitry innerlayers will not evidence pink ring formation since there is no copper oxide present for localized dissolution, and localized exposure of underlying copper, in subsequent through-hole processing. As with other techniques, however, processes of this type are suspect in terms of the adhesion attainable between the dielectric substrate layers and the metallic copper circuitry innerlayers. This is particularly so in these reduction processes since the circuitry bonding surface not only is metallic copper, but also presents the metallic copper in distinct phases (i.e., (1) copper-from-reduction-of-copper oxide over (2) copper of the copper foil) which are prone to separation/delamination along the phase boundary.

U.S. Pat. Nos. 4,997,722 and 4,997,516 to Adler similarly involve formation of a copper oxide coating on the copper surfaces of circuitry innerlayers, followed by treatment with a specialized reducing solution to reduce the copper oxide to metallic copper. Certain portions of the copper oxide apparently may not be reduced all the way to metallic copper (being reduced instead to hydrous cuprous oxide or cuprous hydroxide), and those species are thereafter dissolved away in a non-oxidizing acid which does not attack or dissolve the portions already reduced to metallic copper. As such, the multi-layer assembly employing such circuitry innerlayers will not evidence pink ring formation since there is no copper oxide present for localized dissolution, and localized exposure of underlying copper, in subsequent through-hole processing. Here again, however, problems can arise in terms of the adhesion between the dielectric layers and metallic copper circuitry innerlayers, firstly because the bonding surface is metallic copper, and secondly because the metallic copper predominately is present in distinct phases (i.e., (1) copper-from-reduction-of-copper oxide over (2) copper of the copper foil), a situation prone to separation/ delamination along the phase boundary.

U.S. Pat. No. 5,289,630 to Ferrier et al., the teachings of which are incorporated herein by reference in their entirety, reveals a process whereby an adhesion promoting layer of copper oxide is formed on the circuit elements followed by a controlled dissolution and removal of a substantial amount of the copper oxide in a manner which does not adversely affect the topography.

PCT Application No. WO 96/19097 to McGrath (and related U.S. Pat. No. 5,800,859), discusses a process for improving the adhesion of polymeric materials to a metal surface. The process discussed involves contacting the metal surface with an adhesion-promoting composition comprising hydrogen peroxide, an inorganic acid, a corrosion-inhibitor and a quaternary ammonium surfactant.

U.S. Pat. No. 5,869,130 issued to Ferrier discloses a process for treating metal surfaces with a composition comprising an oxidizer, an acid, a corrosion inhibitor, a source of halide ions and optionally a water soluble polymer in order to increase the adhesion of polymeric materials to the metal surface.

This invention proposes a process for improving the adhesion of polymeric materials to a metal surface, especially copper or copper alloy surfaces. The process proposed herein is particularly useful in the production of multilayer printed circuits. The process proposed herein provides optimum adhesion between the metallic and polymeric surfaces (ie. the circuitry and the intermediate insulating layer), eliminates or minimizes pink ring and operates economically, all as compared to conventional processes.

SUMMARY OF THE INVENTION

The inventors herein propose a process for improving the adhesion of polymeric materials to metal surfaces, particularly copper and copper alloy surfaces. The proposed process comprises:

1). Contacting the metal surface with an adhesion-promoting composition comprising:

a) an oxidizer;
    b) an acid;
    c) a corrosion inhibitor;
    d) a benzotriazole with an electron withdrawing group in the 1 position which group is a stronger electron withdrawer than a hydrogen group; and
    e) optionally, a source of adhesion enhancing species, which species are selected from the group consisting of molybdates, tungstates, tantalates, niobates, vanadates, isopoly or heteropoly acids of molybdenum, tungsten, tantalum, niobium, vanadium, and combinations of any of the foregoing.

2) thereafter bonding the polymeric material to the metal surface.

The inventors have found that the foregoing process improves the adhesion of metal surfaces to the polymeric materials, particularly when the metal surfaces comprise copper or copper alloys. The process proposed is particularly suited to the production of multilayer printed circuit boards.

DETAILED DESCRIPTION OF THE INVENTION

The inventor herein has found that the adhesion between a metal surface and a polymeric material is enhanced by contacting the metal surface with an adhesion-promoting composition prior to bonding the polymeric material to the metal surface. The invention therefore proposes a process for increasing the adhesion of a polymeric material to a metal surface, said process comprising:

1) contacting the metal surface with an adhesion-promoting composition comprising:

a) an oxidizer;
    b) an acid;
    c) a corrosion inhibitor;
    d) preferably, a benzotriazole with an electron withdrawing group in the 1-position which electron withdrawing group is a stronger electron withdrawer than a hydrogen group and which electron withdrawing group is preferably selected from the group consisting of hydroxy groups, amino groups, nitro groups, nitrile groups, sulfonate groups, carboxylate groups, halide groups, mercaptan groups, and unsaturated alkyl groups; and
    e) optionally, adhesion enhancing species, which species are selected from the group consisting of molybdates, tungstates, tantalates, niobates, vanadates, isopoly or heteropoly acids of molybdenum, tungsten, tantalum, niobium, vanadium, and combinations of any of the foregoing.
    f) optionally, a water soluble polymer;
    g) preferably, a source of halide ions; and 2) thereafter bonding the polymeric material to the metal surface.

The inventors have found that the proposed adhesion-promoting composition produces a roughened coated surface upon the metal. The surface produced is particularly suited to bonding with polymeric materials in that significantly increased adhesion values are achieved as compared to a non-treated metal surface. In addition the coated (treated) metal surface maintains the increased adhesion over time and decreases the likelihood of any unwanted reactions occurring over time between the metal and the polymeric material.

The process proposed is particularly suited to the manufacture of multilayer printed circuit boards. Thus, in this application, the metal circuitry (usually copper) of the innerlayers is treated with the adhesion-promoting composition proposed herein. After treatment, followed by water rinsing, the innerlayers are bonded together with polymeric materials such as pre-pregs or imageable dielectrics, resulting in the multilayer printed circuit board.

The metal surface to be treated may comprise a variety of metals such as copper, copper alloys, nickel and iron. However, the process of the invention produces the best results when the metal surfaces comprise copper or copper alloys. The polymeric material may be a variety of polymeric materials including pre-preg materials, imageable dielectrics, photoimageable resins, soldermasks, adhesives or polymeric etch resists.

The oxidizer used in the adhesion-promoting composition may comprise any oxidizer which is capable of oxidizing the metal surface in the matrix of the adhesion-promoting composition. The inventors have found hydrogen peroxide and persulfates to be particularly preferred oxidizers for use in the process of the invention, with hydrogen peroxide being the most preferred oxidizer. The concentration of the oxidizer in the adhesion-promoting composition may range from 2 to 60 grams per liter but is preferably from 3 to 30 grams per liter.

The acid utilized in the adhesion-promoting composition may be any acid which is stable in the matrix, however, the inventors have found mineral acids to be particularly preferred. Sulfuric acid is especially preferred. The concentration of the acid in the adhesion-promoting composition may range from 5 to 360 grams per liter but is preferably from 20 to 110 grams per liter.

The corrosion inhibitor used in the adhesion-promoting composition is a compound which effectively reacts with the metal surface to form a protective complex layer. Preferred corrosion inhibitors are selected from the group consisting of triazoles, benzotriazoles, tetrazoles, imidazoles, benzimidazoles and mixtures of the foregoing. Benzotriazoles are particularly preferred. The concentration of the corrosion inhibitor in the adhesion-promoting composition may range from 0.2 to 20 grams per liter but is preferably from 1 to 12 grams per liter.

The inventors have found that the addition of a benzotriazole with an electron withdrawing group in the 1-position, which electron withdrawing group is a stronger electron withdrawer than a hydrogen group, produces advantages with respect to the uniformity of the coating produced and the adhesion achieved after bonding. The inventors have found that the electron withdrawing group is preferably selected from the group consisting of hydroxy groups, amino groups, nitro groups, nitrile groups, sulfonate groups, carboxylate groups, halide groups, mercaptan groups and unsaturated alkyl groups. Most preferably the electron withdrawing group is a hydroxy group and thus the most preferable material in this regard is 1-hydroxy benzotriazole with the following structure:

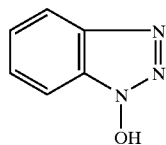

The corrosion inhibitor and the benzotriazole with an electron withdrawing group in the 1-position may both be the same compound. For instance, 1-hydroxybenzotriazole may fill the roles of both the corrosion inhibitor and the benzotriazole with the electron withdrawing group in the 1-position.

The advantages achievable with the use of the foregoing materials are most pronounced when a source of adhesion enhancing species, as described below, is used in conjunction with the foregoing materials in the adhesion-promoting composition. The inventors have found that the combination proposed produces synergistic effects. The concentration of the benzotriazole with the electron withdrawing group in the 1-position can range from 0.2 g/l to 20 g/l but is preferably from 0.5 g/l to 5 g/l.

The source of adhesion enhancing species can be any material which will supply species selected from the group consisting of molybdates, tungstates, tantalates, niobates, vanadates and mixtures thereof to the adhesion promoting composition. Such sources include alkali metal salts of molybdates, tungstate, tantalates, niobates, vanadates and mixtures thereof such as sodium (or potassium) molybdate, tungstate, niobate or vanadate, and heteropoly acids or isopoly acids of molybdenum, tungsten, tantalum, niobium or vanadium. Thus, molybdates or tungstates which include hetero atoms such as phosphorous, silicon, cobalt, manganese and tungsten are suitable. Preferred sources include iso and hetero polyacids of molybdenum, tungsten, niobium, vanadium and mixtures thereof such as molybdic acid, vanadic acid and tungstic acid. The most preferred source of adhesion enhancing species is molybdic acid. The concentration of adhesion enhancing species in the adhesion promoting composition may range from 1 mg/l to 500 mg/l (based on the adhesion enhancing ion content) but is preferably from 5 mg/l to 200 mg/l. The adhesion-enhancing species may be utilized with or without the benzotriazole with the electron withdrawing group in the 1-position.

Optionally, the adhesion-promoting composition may also comprise a water soluble polymer. If used, the water soluble polymer is preferably not a wetter or surfactant but is instead a water soluble homopolymer or copolymer of low molecular weight water soluble monomers. Most preferably, the water soluble polymer is a polymer of ethylene oxide, polyethylene glycols, polypropylene glycols or polyvinyl alcohols. Among the most preferred are the polymers of ethylene oxide, or polyethylene glycols sold by the Union Carbide company under the tradename Carbowax. The inventors have found Carbowax 750 and Carbowax MPEG 2000 to be particularly useful. Also particularly useful are the ethylene oxide homopolymers sold by the BASF company under the Pluronic tradename. The concentration of the water soluble polymer in the adhesion-promoting composition can range from 1 to 15 grams per liter, but is preferably from 3 to 6 grams per liter.

Thus, the adhesion-promoting composition should contain an acid, an oxidizer and a corrosion inhibitor. Preferably the composition also comprises a benzotriazole with an electron withdrawing group in the 1-position as described herein or the corrosion inhibitor may be the benzotriazole with the electron withdrawing group in the 1-position. In either case, the composition preferably also comprises adhesion enhancing species as described herein, whether the benzotriazole with the electron withdrawing group in the 1-position is used or not.

Preferably, the adhesion-promoting composition also contains a source of halide ions, which are compounds that provide halide ions in the matrix of the adhesion-promoting composition. Preferably, the source of halide ions are alkaline metal salts such as sodium chloride or potassium chloride, oxohalides such as sodium chlorate or potassium chlorate, or halide bearing mineral acids such as hydrochloric acid. Preferably the source of halide ions provides chloride ions to the adhesion-promoting composition and most preferably the source of halide ions provides chlorate ions to the adhesion-promoting composition. The concentration of the source of halide ions in the adhesion promoting composition may range from 5 to 500 milligrams per liter but is preferably from 10 to 50 milligrams per liter, all based on halide ion content.

The metal surface can be treated with the adhesion-promoting composition in a variety of ways, including immersion, spray, or flood. The temperature of the adhesion-promoting composition during treatment may range from 80° F. to 150° F. but is preferably from 90° F. to 120° F. The treatment time will vary depending upon the temperature and method of treatment but may range from 15 seconds to 15 minutes and is preferably from 1 to 2 minutes.

The following examples are illustrative of the invention but should not be taken as limiting:

The following cycle was used in processing the copper clad panels and copper foils in the following examples:

|  | Time (Min) |
|---|---|
| 5% Sulfuric acid, 70° F. | 1 |
| Cold Water Rinse | 1 |
| Metex Brass Soak Cleaner S-426, 150° F. | 2 |
| Cold Water Rinse | 2 |
| Predip (2 gr/l benzotriazole, 1% v/v 50% H$_2$O$_2$), 70° F. | 1 |
| Test Solution | 1 |
| Cold Water Rinse | 1 |
| Forced Air Dry | 1 |

EXAMPLES 1–15

A base adhesion-promoting solution was prepared containing 2% by volume sulfuric acid (98% by weight), 0.75% by volume of 50% by weight hydrogen peroxide, 4 gr/l benzotriazole and the remainder water. For each example the amount of hydroxybenzotriazole hydrate and molybdic acid shown in Table I below were added to the foregoing base solution and copper foils and panels were processed through the standard cycle noted above with the specified test solution in each case at the temperatures indicated for each example. The appearance achieved for each example is noted in Table I below.

TABLE I

| Example | 1-Hydroxy-benzo-triazole hydrate | Molybdic Acid | Temperature | Appearance |
|---|---|---|---|---|
| 1 | 0 g/L | 0 mg/L | 100° F. | nonuniform dark pink |
| 2 | 1 g/L | 0 mg/L | 100° F. | nonuniform dark pink |
| 3 | 2 g/L | 0- mg/L | 100° F. | uniform dark pink |
| 4 | 3 g/L | 0 mg/L | 100° F. | uniform dark pink |
| 5 | 3 g/L | 0 mg/L | 110° F. | uniform very dark pink |
| 6 | 3 g/L | 0 mg/L | 120° F. | uniform dark pink |
| 7 | 3 g/L | 10 mg/L | 100° F. | nonuniform dark brown |
| 8 | 3 g/L | 10 mg/L | 110° F. | uniform very dark brown |
| 9 | 3 g/L | 10 mg/L | 120° F. | uniform dark brown |
| 10 | 3 g/L | 20 mg/L | 100° F. | uniform very dark brown |
| 11 | 3 g/L | 20 mg/L | 110° F. | uniform dark brown |
| 12 | 3 g/L | 20 mg/L | 120° F. | uniform dark brown |
| 13 | 3 g/L | 30 mg/L | 100° F. | uniform brown |
| 14 | 3 g/L | 30 mg/L | 110° F. | uniform dark brown |
| 15 | 3 g/L | 30 mg/L | 120° F. | uniform very dark brown |

After processing, the panels and foils were baked for 30 minutes at 230° F., then laminated at 350° F. and 200 pounds per square inch pressure for 45 minutes with NELCO N4205-2 B Stage (FR-4) (available from the NELCO Company). The B-Stage consisted of one sheet of 7628 glass sandwiched between two sheets of 1080 glass. Following lamination the panels were imaged to form one inch wide strips and excess copper was removed. The stripped panels were baked for 2 hours at 230° F., then immersed in 550° F. solder for zero, ten and twenty seconds. The strength of the copper to resin bond was measured by peeling the foil strips from the resin and the results are reported in Table II below.

TABLE II

| Example | Appearance | Appearance after Solder | Peel Strength, 0 Seconds Solder | Peel Strength, 10 Seconds Solder | Peel Strength, 20 Seconds Solder |
|---|---|---|---|---|---|
| 1 | nonuniform dark pink | nonuniform dark pink | 3.5 lb/in | 3.2 lb/in | 3.8 lb/in |
| 2 | nonuniform very dark pink | nonuniform very dark pink | 4.2 lb/in | 3.8 lb/in | 3.8 lb/in |
| 3 | uniform brown/pink | uniform brown/pink | 4.8 lb/in | 415 lb/in | 4.2 lb/in |
| 4 | uniform brown/pink | uniform brown/pink | 5.5 lb/in | 5.0 lb/in | 5.0 lb/in |
| 5 | uniform dark brown | uniform dark brown | 6.0 lb/in | 4.8 lb/in | 4.8 lb/in |
| 6 | uniform dark brown | uniform dark brown | 3.0 lb/in | 2.0 lb/in | 1.8 lb/in |
| 7 | uniform dark brown | uniform dark brown | 5.2 lb/in | 4.8 lb/in | 4.8 lb/in |
| 8 | uniform purple/brown | uniform purple/brown | 6.2 lb/in | 5.5 lb/in | 5/2 lb/in |
| 9 | uniform purple/brown | uniform purple/brown | 6.2 lb/in | 5.8 lb/in | 5.0 lb/in |
| 10 | uniform purple/brown | uniform purple/brown | 5.5 lb/in | 5.0 lb/in | 4.8 lb/in |
| 11 | uniform purple/brown | uniform purple/brown | 5.8 lb/in | 5.2 lb/in | 5.2 lb/in |
| 12 | uniform purple/brown | uniform purple/brown | 6.0 lb/in | 5.2 lb/in | 4.8 lb/in |
| 13 | uniform purple/brown | uniform purple/brown | 5.5 lb/in | 5.0 lb/in | 4.8 lb/in |

TABLE II-continued

| Example | Appearance | Appearance after Solder | Peel Strength, 0 Seconds Solder | Peel Strength, 10 Seconds Solder | Peel Strength, 20 Seconds Solder |
|---|---|---|---|---|---|
| 14 | uniform purple/brown | uniform purple/brown | 5.5 lb/in | 5.0 lb/in | 5.O lb/in |
| 15 | uniform purple/brown | uniform purple/brown | 5.5 lb/in | 5.0 lb/in | 4.2 lb/in |

The examples clearly demonstrate the advantages achievable in appearance and adhesion with the process of this invention.

EXAMPLE 16

Example 1 was repeated except that in this case the concentration of benzotriazole in the test solution was increased from 4 gr/l to 7 gr/l. As in example 1, no 1-hydroxybenzotriazole or molybdic acid was used. The result was a uniform pink appearance. The peel strength achieved was 2.8 $^{lb}$/in, 2.5 $^{lb}$/in and 2.5 $^{lb}$/in for 0 sec., 10 sec. and 20 sec. respectively in 550° F. solder.

EXAMPLE 17

A copper treatment solution consisting of 4.6% by volume sulfuric acid, 2.8% by volume of 50% hydrogen peroxide, 6.3 g/L benzotriazole, approximately 15 mg/L sodium chloride, approximately 1 g/L Carbowax MPEG 2000 polyethylene oxide, and 21.6 g/L copper ion (in order to simulate an aged or used adhesion promoting composition e.g. as the adhesion promoting composition is utilized with copper surfaces copper ions build in the solution) was heated to approximately 950° F. A fresh predip solution consisting of 2 g/L benzotriazole and 2% by volume of 50% hydrogen peroxide was made up. A copper clad resin panel approximately 1.5 inches wide by 3 inches high was weighed and run through the following treatment cycle:

| Metex 9271 Acid Cleaner,* 10%, 125° F. | 2 minutes |
|---|---|
| Cold Water Rinse | 2 minutes |
| Predip, Room Temperature | 1 minute |
| Copper Treatment Solution, 95° F. | 1 minute |
| Cold Water Rinse | 1 minute |
| Forced Air Dry | |

*Available from MacDermid, Incorporated of Waterbury, CT.

After treatment the panel had a purple/tarnish surface appearance. The panel was weighed and the approximate thickness of copper removed from the surface was calculated from the weight loss. A copper clad resin panel and a copper foil of one ounce thickness were then run through the same cycle. 50 mg/L molybdic acid were then added to the copper treatment solution and the experiment was repeated. Further additions of 50 mg/L molybdic acid were made, with the appropriate experiments being run after each addition, to a total addition of 150 mg/L molybdic acid. The matching cores and foils were laminated together with Nelco 4205-2 glass/epoxy B stage. Following lamination the panels were etched to provide one inch wide strips on the foil side, baked and immersed in tin/lead solder at 550° F. for zero, ten and twenty seconds. Peel strengths were then determined on each panel after the solder immersion. The following results were obtained:

| Run | Etch | 0 Sec Solder | 10 Sec Solder | 20 Sec' Solder |
|---|---|---|---|---|
| 0 mg/L Molybdic Acid | 65 μin | 3.2 lb/in | 3.2 lb/in | 2.0 lb/in |
| 50 mg/L Molybdic Acid | 70 μin | 4.2 lb/in | 4.2 lb/in | 3.5 lb/in |
| 100 mg/L Molybdic Acid | 65 μin | 4.8 lb/in | 4.5 lb/in | 4.0 lb/in |
| 150 mg/L Molybdic Acid | 65 μin | 5.0 lb/in | 4.8 lb/in | 4.8 lb/in |

Increasing molybdic acid concentration in this system clearly provides an increase in copper/resin peel strength for both unsoldered and solder stressed conditions.

EXAMPLE 18

A copper treatment solution comprising approximately 3% by volume of sulfuric acid, 0.75% by volume of 50% hydrogen peroxide, 8 g/L benzotriazole and 30 mg/L potassium chlorate was made up. A predip of 2 g/L benzotriazole and 1% by volume of 50% hydrogen peroxide was also made up. Etch rate panels and cores and foils were run through the cycle of Example 1, substituting the present treatment bath and predip for the treatment bath and predip used in Example 1. Runs were made at treatment bath temperatures of approximately 100° F. An addition of 10 mg/L molybdic acid was then made to the treatment bath and the experiments were repeated. After treatment the cores and foils were laminated, etched, baked and immersed in solder as in Example 1. The following results were observed:

| Run | Etch | 0 Sec Solder | 10 Sec Solder | 20 Sec Solder |
|---|---|---|---|---|
| 0 mg/L Molybdic Acid, 100° F. | 20 μin | 4.0 lb/in | 3.8 lb/in | 3.0 lb/in |
| 10 mg/L Molybdic Acid, 100° F. | 18 μin | 5.2 lb/in | 4.5 lb/in | 4.0 lb/in |
| 0 mg/L Molybdic Acid, 110° F. | 25 μin | 4.8 lb/in | 4.5 lb/in | 3.0 lb/in |
| 10 mg/L Molybdic acid, 110° F. | 25 μin | 5.8 lb/in | 4.5 lb/in | 3.5 lb/in |
| 0 mad/L Molybdic Acid, 120° F. | 25 μin | 5.5 lb/in | 4.2 lb/in | 3.2 lb/in |
| 10 mg/L Molybdic Acid, 120° F. | 25 μin | 6.2 lb/in | 5.2 lb/in | 3.2 lb/inI |

Again, it is clear that addition of the molybdate ion to the copper treatment solution gives an improvement in bonding of copper to resin.

What is claimed is:

1. A process for increasing the adhesion of a polymeric material to a metal surface, which metal surface comprises copper, said process comprising:

a). contacting the metal surface with an adhesion-promoting composition comprising:
        1. 2 to 60 grams per liter of hydrogen peroxide;
        2. 5 to 360 grams per liter of an inorganic acid;
        3. a benzotriazole with an electron withdrawing group in the 1-position which electron withdrawing group is a stronger electron withdrawer than a hydrogen group; and
b. bonding the polymeric material to the metal surface.

2. A process according to claim 1 wherein the electron withdrawing group is selected from the group consisting of hydroxy groups, amino groups, nitro groups, sulfonate groups, carboxylate groups, halide groups, mercaptan groups and unsaturated alkyl groups.

3. A process according to claim 1 wherein the benzotriazole is 1-hydroxybenzotriazole.

4. A process for increasing the adhesion of a polymeric material to a metal surface, wherein the metal surface comprises copper, said process comprising:
   a). contacting the metal surface with an adhesion-promoting composition comprising:
      1. 2 to 60 grams per liter of hydrogen peroxide;
      2. 5 to 360 grams per liter of an inorganic acid;
      3. 0.2 to 20 grams per liter of a corrosion inhibitor;
      4. a benzotriazole with an electron withdrawing group in the 1-position which electron withdrawing group is a stronger electron withdrawer than a hydrogen group; and
      5. optionally, a source of adhesion enhancing species, which species are selected from the group consisting of molybdates, tungstates, tantalates, niobates, vanadates, isopoly or heteropoly acids of molybdenum, tungsten, tantalum, niobium, vanadium, and combinations of any of the foregoing.
   b) bonding the polymeric material to the metal surface.

5. A process according to claim 4 wherein the corrosion inhibitor is benzotriazole.

6. A process according to claim 4 wherein the electron withdrawing group is selected from the group consisting of hydroxy groups, amino groups, nitro groups, nitrile groups, sulfonate groups, carboxylate groups, halide groups, mercaptan groups, and unsaturated alkyl groups.

7. A process according to claim 4 wherein the adhesion enhancing species comprise molybdate ions.

8. A process according to claim 4 wherein the corrosion inhibitor is selected from the group consisting of triazoles, benzotriazoles, imidazoles, benzimidazoles, tetrazoles and mixtures of the foregoing.

9. A process according to claim 4 wherein the benzotriazole with the electron withdrawing group is 1-hydroxy benzotriazole with the following structure:

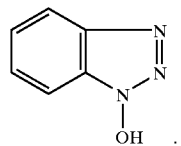

10. A process according to claim 4 comprising a source of halide ions.

11. A process according to claim 9 wherein the concentration of hydrogen peroxide is from 3 to 30 grams per liter.

12. A process according to claim 11 wherein the adhesion enhancing species are present and comprise molybdate ions.

13. A process according to claim 12 wherein the corrosion inhibitor is selected from the group consisting of triazoles, benzotriazoles, imidazoles, tetrazoles, benzimidazoles, and mixtures of the foregoing.

14. A process according to claim 13 wherein the concentration of the inorganic acid is from 20 to 110 grams per liter.

15. A composition useful in treating metal surfaces prior to bonding polymeric materials to the metal surfaces, said composition comprising:
   a. 2 to 60 grams per liter of hydrogen peroxide;
   b. 5 to 360 grams per liter of an inorganic acid;
   c. a corrosion inhibitor;
   d. a benzotriazole with an electron withdrawing group in the 1-position which electron withdrawing group is a stronger electron withdrawer than a hydrogen group; and
   e. optionally, a source of adhesion enhancing species, which species are selected from the group consisting of molybdates, tungstates, tantalates, niobates, vanadates, isopoly or heteropoly acids of molybdenum, tungsten, tantalum, niobium, vanadium, and combinations of any of the foregoing.

16. A composition according to claim 15 wherein the concentration of hydrogen peroxide is from 3 to 30 grams per liter.

17. A composition according to claim 15 wherein the electron withdrawing group is selected from the group consisting of hydroxy groups, amino groups, nitro groups, nitrile groups, sulfonate groups, carboxylate groups, halide groups, mercaptan groups, and unsaturated alkyl groups.

18. A composition according to claim 17 wherein the adhesion enhancing species are present and comprise molybdate ions.

19. A composition according to claim 18 wherein the corrosion inhibitor is selected from the group consisting of triazoles, benzotriazoles, imidazoles, tetrazoles, benzimidazoles, and mixtures of the foregoing.

20. A composition according to claim 19 wherein the benzotriazole with the electron withdrawing group is 1-hydroxy benzotriazole with the following structure:

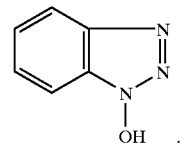

21. A composition according to claim 20 comprising a source of halide ions.

22. A composition useful in treating metal surfaces prior to bonding polymeric materials to the metal surfaces, said composition comprising:
   a. 2 to 60 grams per liter of hydrogen peroxide;
   b. 5 to 360 grams per liter of an inorganic acid;
   c. 1-hydroxybenzotriazole; and
   d. optionally, a source of adhesion enhancing species, which species are selected from the group consisting of molybdates, tungstates, tantalates, niobates, vanadates, isopoly or heteropoly acids of molybdenum, tungsten, tantalum, niobium, vanadium and combinations of the foregoing.

23. A composition according to claim 22 wherein the composition also comprises a corrosion inhibitor other than 1-hydroxybenzotriazole.

24. A composition according to claim 23 wherein the corrosion inhibitor is selected from the group consisting of triazoles, benzotriazoles, imidazoles, benzimidazoles, tetrazoles, and mixtures of the foregoing.

25. A composition according to claim 24 wherein the adhesion enhancing species are present and comprise molybdate ions.

26. A composition according to claim 25 wherein the concentration of the hydrogen peroxide is from 3 to 30 grams per liter.

27. A composition useful in treating metal surfaces prior to bonding polymeric materials to metal surfaces, said composition comprising:
   a. an oxidizer;
   b. an acid;
   c. a benzotriazole with an electron withdrawing group in the 1-position which electron withdrawing group is a stronger electron withdrawer than a hydrogen group.

28. A composition according to claim 27 wherein the electron withdrawing group is selected from the group consisting of hydroxy groups, amino groups, nitro groups, sulfonate groups, carboxylate groups, halide groups, mercaptan groups, and unsaturated alkyl groups.

29. A composition according to claim 27 wherein the benzotriazole is 1-hydroxybenzotriazole.

* * * * *